United States Patent [19]

Banks

[11] Patent Number: 5,185,675
[45] Date of Patent: Feb. 9, 1993

[54] ELECTRO OPTIC MODULATOR SYSTEMS FOR FIBER OPTIC INFORMATION TRANSMISSION

[75] Inventor: Frank J. Banks, Leucada, Calif.

[73] Assignee: Moog, Inc., East Aurora, N.Y.

[21] Appl. No.: 441,324

[22] Filed: Nov. 27, 1989

[51] Int. Cl.$^5$ .............................................. G02F 1/03
[52] U.S. Cl. ................... 359/181; 359/245; 324/109; 324/96; 250/227.21
[58] Field of Search ....................... 455/605, 612, 617; 250/227.14, 227.17, 227.18, 227.21; 350/96.15, 96.33, 374, 376, 378, 384–386, 389–391; 324/96, 77 K, 118, 109, 97; 73/653, 657; 359/181–183, 245–248

[56] References Cited

U.S. PATENT DOCUMENTS

| | | | |
|---|---|---|---|
| 4,322,978 | 4/1982 | Fromm | 250/227.21 |
| 4,547,729 | 10/1985 | Adolfsson et al. | 324/96 |
| 4,567,771 | 2/1986 | Nelson et al. | 73/653 |
| 4,920,310 | 4/1990 | Aoshima et al. | 324/96 |
| 4,950,884 | 8/1990 | Banks | 250/227.21 |

OTHER PUBLICATIONS

Sheiner et al.; "Direct Conversion . . ."; IBM Tech. Dis. Bull.; vol. 22, No. 1; Jun. 1979, pp. 208–209.

Primary Examiner—Edward L. Coles, Sr.
Assistant Examiner—Jill Jackson
Attorney, Agent, or Firm—Frank D. Gilliam

[57] ABSTRACT

A system for transducing a signal voltage into an optical signal, transmitting the optical signal via an optical fiber to a remote location in the form of light attenuation frequency and interpreting the light frequency at the remote location to the amplitude and wave form of the signal voltage. The electro optic modulator includes an elongated piezoelectric member which changes length when an electric field is imposed across it. A mirror is attached to a free end of the piezoelectric member and strains or alternately moves toward and away from a partially reflecting surface at the end of an adjacent optical fiber. Light is introduced into the fiber with a portion reflected back by the movable mirror and part by the end of the fiber. A detector at the second end of the optical fiber receives the reflected light. As the movable mirror is moved in response to voltage changes, the phase changes between the light reflected into the optical fibers from the movable mirror will correspondingly vary with that reflected by the end of the fiber resulting in a light signal corresponding in amplitude and frequency to the original voltage signal. The photo detector at the second end of the fiber converts the optical signal back to a voltage signal.

7 Claims, 1 Drawing Sheet

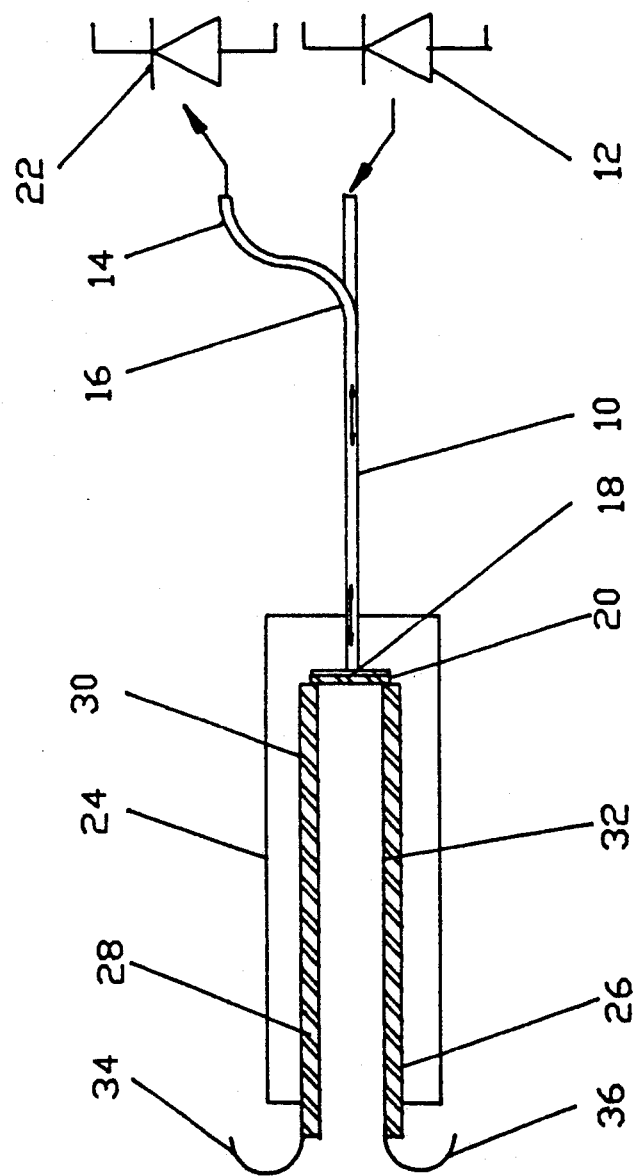

ELECTRO OPTIC MODULATOR SYSTEMS FOR FIBER OPTIC INFORMATION TRANSMISSION

BACKGROUND OF THE INVENTION

This invention relates in general to the transmission of varying information from remote locations and, more particularly, to an electro optic system for transducing a voltage signal into an optical signal, transmitting the signal via an optical fiber to a distant location and interpreting the signal.

Often it is necessary to sense varying information such as voltage or current in an electrical power system or temperature or pressure in a hydraulic system for use at a distant location. The sensing location may be hostile due to high temperatures or other severe environmental conditions. Or the location may be inaccessible so that direct observation of the varying condition cannot be accomplished such as in the measurement of aircraft engine or control surface conditions. In the past a variety of mechanical, hydraulic and electrical arrangements have been used to transmit information from remote sensors to central control stations, such as an aircraft cockpit, the bridge of a ship or a power station control room. While these systems are often effective, they are generally heavy, complex and subject to physical damage.

Electrical sensing and information transmission systems are widely used due to their light weight, ease of assembly and ability to provide convenient redundant signal paths to protect against signal loss due to damage to one wire. However, these systems are subject to power failures, short circuits in the wires, electromagnetic interference (EMI) from nearby wiring or electrical devices and are potentially subject to destruction by electromagnetic pulses (EMP) from nuclear explosions or other sources. There is a particular need to overcome these problems in military aircraft, missiles and ships and in automated machine tools and robotics where electromagnetic interference poses serious problems.

Recently, considerable interest has developed in using optical fiber systems for remote sensing and control applications. Optical fibers have many of the advantages of the electrical wired systems while being impervious to electrical short circuits, EMI and EMP. A typical fiber optic temperature or pressure sensing system as disclosed by Anderson et al. in U.S. Pat. No. 4,672,199 uses a mirror on a temperature responsive bimetallic strip or a pressure responsive piston to vary the light transmitted through a fiber to a light sensor. The system measures only temperature quantity and cannot transmit amplitude and wave form information from a sensed electrical signal. Other systems which sense variations in an optical property, such as light intensity, and transmit a corresponding light signal through an optical fiber to a detector are described by Adolfsson et al. in U.S. Pat. Nos. 4,417,140 and 4,433,238 and by Brogardh in U.S. Pat. No. 4,531,230. While each of these disclosed fiber optic sensing systems is effective for the limited purposes described, they cannot transduce very low power level electrical signals into optical signals without electronic circuitry or supplemental electrical power at the transmitter location and do not transmit a signal providing sensed voltage amplitude and wave form information.

Thus, there is a continuing need for simple, accurate, remote sensing systems which are capable of transducing low voltage/low power electrical signal frequency, amplitude and waveform information with a transmitter which can operate in a harsh environment without electronic components or supplemental electrical power.

SUMMARY OF THE INVENTION

The above-noted problems, and others, are overcome by the electro optic modulator of this invention, which basically comprises an optical fiber having a photodiode at one end for receiving light, a light emitting diode intermediate the fiber ends for introducing light into the fiber and a light modulating systems at the second end which receives the light and returns a modulated signal through the fiber to the photo diode.

The modulating system includes a partially reflecting surface at the second fiber end which partially reflects and partially transmits the light emitted by the fiber. The reflector is movably mounted adjacent to the fiber end for either straining or alternately moving toward or away from the fiber end. The reflector is operatively connected to a free end of an elongated piezoelectric member so that lengthening or shortening of the piezoelectric member causes the reflector to either strain or alternately move toward or away from the second fiber end. A housing surrounds the piezoelectric member and rigidly supports the second end of the piezoelectric member and the reflector and also retains the fiber adjacent to the reflecting surface. Electrical connection means is connected to the fixed end of the piezoelectric member so that a variable voltage can be imposed thereon.

In typical operation, a sensed varying voltage signal is imposed on the piezoelectric member electrodes causing a proportional change in member length. In turn, this causes a proportional strain or proportional change in the position of the reflector relative to the fiber end. Thus, the resulting light frequency passing back through the optical fiber to the photodiode is proportional in amplitude and waveform to the signal voltage.

This configuration has an advantage in that the light traveling through the electro optic material and the electric field is guided via a light guide. The electrodes have a very highly reflective surface against the optical material. The electrode edges are preferably surrounded by an optical gel with an index of refraction lower than the optical material which acts as a graded index lens and is also an effective reflector. The end of the light guide is coated with the fully reflective material such that the light is reflected back through the light guide to be guided though the electro optical material and between the electrodes and into the graded index lens to be focused into the fiber.

A preferred reflective electrode is aluminum because of its reflectivity and adhesion to the electro optic material.

This system is both simple and sturdy, with the modulating systems fully enclosed in a sturdy housing. No external electric power is required at the sensing location, other than the low-voltage, low-power signal to be sensed. Thus, this system is particularly adapted to use in remote, harsh environments. No electronic components are required at the sensing location. The system is linear and thermally stable.

The system is responsive to both single and multimode light.

BRIEF DESCRIPTION OF THE DRAWING

Details of the invention, and of a preferred embodiment thereof, will be further understood upon reference to the drawing wherein:

The Figure shows a schematic representation of the modulator assembly of this invention, partially cutaway for clarity.

DETAILED DESCRIPTION OF THE PREFERRED EMBODIMENT

Referring now to the Figure, there is seen an optical fiber 10 which may have any suitable length, typically up to about 50 meters long. Any suitable optical fiber may be used. Typical fibers include those available from Ensign Bickford Optical under the HC108T or Spec Traguide 202R trademarks. Light is directed into fiber 10 from a light emitting diode 12, through a conventional fiber tap 16. Any suitable light emitting diode may be used, such as the IRE-161-002 from Laser Diode Inc.

Light from light emitting diode 12 passing along fiber 10 reaches the end of the fiber, where it is partially transmitted external to the fiber and partially reflected back into the fiber by the fiber end from a partially reflecting surface 18. While the polished end of fiber 10 may serve as the partial reflecting surface 18, that surface is preferably coated with a material, such as aluminum, so that reflectivity can be adjusted during coating to transmit a selected portion of the incident light and reflect the balance.

Fiber 10 is butted against reflector 20 which is axially movable to strain or alternately move toward and away from the end of fiber 10. The reflector 20 is mounted on the free end of piezoelectric member 28.

Light from photodiode 12 is reflected partially from fiber end 10 and fully from reflector 20, back though fiber 10 to photodiode 22 which converts the signal back into an electrical signal, as detailed below.

Tubular Piezoelectric member 28 is housed in a tubular housing 24 to which the second end 26 of the piezoelectric member is rigidly attached. Reflector 20 is rigidly attached to the first end of piezoelectric member 28. The preferred configuration of member 28 is tubular.

Housing 24 is fabricated from material having a coefficient of thermal expansion matching that of piezoelectric element 28, thereby resulting is a constant relationship between the end of fiber 10 and mirror 20 when both are exposed to the same temperature gradient.

A signal voltage from any suitable source is applied to positive electrode 30 and negative electrodes 32 on piezoelectric member 28 via lead wires 34 and 36. Member 28 has the characteristics of changing length or straining in proportion to the voltage impressed thereon.

Any suitable piezoelectric material may be used, with suitable dimensions. Typical materials include lead-zirconium-titanium materials, available from Motorola or Physik Instrument or PZT from Vernitron Piezoelectric Division. Typically the member may have a length of 2 inches, a wall thickness of 0.005 inch and a diameter of 0.020 inch.

In operation, a signal voltage is applied to electrodes 30 and 32. As member 28 strains or changes length in response to the signal, the free end moves mirror 20 as a function of the voltage signal. Mirror 20 is thus moved or strained relative to the partial reflector 18 on the end of fiber 10 in proportion to the voltage signal.

Light from reflector 20 is reflected back into fiber 10 and is combined with the light directly reflected from fiber end 10. Whenever the two reflected lights are in phase, they combine intensity, while when they are out of phase they subtract intensity by constructive interference. The relationship is a function of the distance the light reflected from the end of fiber 10 travels in relation to light reflected from mirror 20. Each movement of mirror 20 relative to fiber end 10 in the amount of one quarter wave length of light causes one halfwave phase shift or one light attenuation. Since the motion of reflector 20 is a function of the voltage impressed on piezoelectric member 28, the amplitude of the light signal is proportional to the voltage for each one half the number of periods of light and dark and are also proportional to a function of the voltage signal.

The thus modulated light is transmitted via 10 fiber tap 16 and fiber 14 to photo diode 22 which transduces optical modulation to electrical modulation. The number of light to dark periods at photodiode 22 is a function of the amplitude of the signal impressed on member 28. If that signal is alternating, when the light or dark signals are at a maximum rate the signal is at the zero crossing. The number of light to dark signals between maximum rate and minimum rate is proportional to the applied voltage. If the signal is of a known or fixed frequency, the number of light to dark transitions for a given period of time is proportional to the original signal voltage also.

An alternate signal form is created when fiber end 10 is terminated against partial mirror 18 thereby restricting the motion of said partial mirror 18 relative to said fiber end 10 to not more than one eight light wave of motion. When a sine wave voltage signal is applied to the piezoelectric member, a sine wave light attenuation signal is created which is in phase with the said voltage signal. The sine signal form is useful whenever phase or frequency demodulation is desired.

While certain specific materials, dimensions, and arrangements were described in the above description of preferred embodiments, those can be varied, where suitable, with similar results. For example, the movable reflector could be connected to the piezoelectric member other than at right angles if desired and the cell surrounding the piezoelectric member could be filled with a soft material which would not impede member movement but would help thermal stability.

Other variations, ramifications and applications of this invention will occur to those skilled in the art upon reading this disclosure. Those are intended to be included within the scope of this invention, as defined in the appended claims.

We claim:

1. An electro optic modulator which comprises:
   an elongated piezoelectric member adapted to change length in proportion to a voltage impressed thereon;
   a housing surrounding said piezoelectric member and rigidly supporting one end thereof:
   optical reflecting means mounted on the second, free, end of said piezoelectric member;
   an optical fiber having a first end supported by said housing with said first end spaced from said reflecting means and adapted to pass light to, and receive light from, said reflecting means;

a partially reflecting surface on said first end of said fiber;

a light emitting diode adapted to direct light into said optical fiber toward said reflecting surface: and a photodiode adapted to receive light from said optical fiber passing from said reflecting surface;

whereby characteristics of the light received by said photodiode are proportional to the amplitude and equal to the phase of the voltage of said voltage impressed on said piezoelectric member and the voltage output of said photodiode is proportional to the amplitude of the voltage impressed on said piezoelectric member.

2. The electro optic modulator according to claim 1 wherein said housing is formed from a material having a coefficient of thermal expansion substantially equal to that of said piezoelectric member.

3. An electro optic modulator which comprises:

an elongated optical fiber:

photodiode means adapted to receive light at a first end of the optical fiber:

light emitting diode means adapted to introduce light into said optical fiber at as point intermediate the first and second ends of said optical fiber;

a partial reflector on the second end of said optical fiber adapted to pass part of said light and reflect the balance of the light back through said fiber to said photodiode means;

a movable reflector adjacent to said partial reflector, said movable reflector movable along a line substantially parallel to said partial reflector and adapted to reflect light passing through said partial reflector from said light emitting diode back through said optical fiber to said first end;

an elongated piezoelectric member having a free first end attached to said movable reflector:

a housing surrounding said piezoelectric member rigidly supporting the second end of said piezoelectric member and said partial reflector: and means for imposing an electrical signal on said piezoelectric member:

whereby the movement of said movable reflector is proportional to said electrical signal imposed on the piezoelectric member and the resulting light frequency amplitude and wave form at the photodiode is proportional in frequency amplitude and wave form to said electrical signal.

4. The electro optic modulator according to claim 3 wherein said housing is formed from a material having a coefficient of thermal expansion substantially equal to that at of said piezoelectric member.

5. In an electro optic modulator having a means for directing light along an optical fiber, means for detecting optical characteristics of light returning along said fiber and means for modulating the returning light in accordance with an electric signal, the improvement wherein said modulating means comprises:

an elongated piezoelectric member adapted to change length in proportion to changes of said electrical signal impressed thereon:

a housing surrounding said piezoelectric member and rigidly supporting one end thereof:

a reflecting means mounted on the second, free, end of the piezoelectric member for movement therewith;

a partially reflecting means secured to said housing having a partially reflecting surface lying substantially parallel to said reflecting surface:

said partially reflecting means adapted to receive light from an optical fiber, transmit a portion of said light to said reflecting means and transmit light from said reflecting means and light reflected from said partially reflecting surface back into the optical fiber.

6. A method of remotely sensing voltage changes which comprises the steps of:

introducing light into an elongated optical fiber intermediate the ends thereof:

partially transmitting and partially reflecting said light at a first end of said fiber;

reflecting said transmitted light back through said fiber from a movable reflector positioned adjacent to said first fiber ends moving said movable reflector toward and away from the first fiber end in response to movement of a free end of an elongated piezoelectric member to modulate the light reflected back through the fiber in accordance with movable reflector movement;

impressing a voltage signal on said piezoelectrical member to cause said free end to move in proportion to the signal; and receiving the light reflected back into said fiber at the second fiber ends;

whereby the resulting light frequency at the second fiber end is identical in wave form and proportional in amplitude and frequency to the voltage signal impressed on said piezoelectric member.

7. The method according to claim 6 further including directing the light reaching the second fiber end to a photodiode to convert the light frequency signal into an electrical signal corresponding to the amplitude and wave form of the voltage signal impressed on said piezoelectric member.

* * * * *